(12) United States Patent
Parikh

(10) Patent No.: US 7,612,592 B2
(45) Date of Patent: Nov. 3, 2009

(54) PROGRAMMABLE DUTY-CYCLE GENERATOR

(75) Inventor: Parag Parikh, Allentown, PA (US)

(73) Assignee: Agere Systems, Inc., Allentown, PA (US)

( * ) Notice: Subject to any disclaimer, the term of this patent is extended or adjusted under 35 U.S.C. 154(b) by 571 days.

(21) Appl. No.: 11/316,555

(22) Filed: Dec. 22, 2005

(65) Prior Publication Data

US 2007/0146029 A1 Jun. 28, 2007

(51) Int. Cl.
*H03K 5/04* (2006.01)
(52) U.S. Cl. .................................. 327/175; 327/172
(58) Field of Classification Search .......... 327/172–175
See application file for complete search history.

(56) References Cited

U.S. PATENT DOCUMENTS 5,757,218 A * 5/1998 Blum ........................... 327/175
5,963,071 A * 10/1999 Dowlatabadi ................ 327/175
6,426,660 B1 * 7/2002 Ho et al. ...................... 327/175
6,650,197 B2 * 11/2003 Sekiya ......................... 332/109

* cited by examiner

*Primary Examiner*—Dinh T. Le
(74) *Attorney, Agent, or Firm*—Mendelsohn, Drucker & Associates, P.C.; Kevin M. Drucker; Steve Mendelsohn

(57) ABSTRACT

A duty-cycle generator including, in one embodiment, a duty-cycle adjustment circuit and a delay processor. The duty-cycle adjustment circuit is adapted to receive an input clock signal having an input duty cycle, generate first and second versions of the input clock signal having different amounts of delay, and combine the first and second versions of the input clock signal to generate an output clock signal having an output duty cycle different from the input duty cycle. The delay processor is adapted to generate at least one control signal for controlling operations of the duty-cycle adjustment circuit based on a comparison of a characteristic of the output clock signal with a corresponding characteristic of a target output clock signal.

22 Claims, 9 Drawing Sheets

DURATION OF TOP DELAY > DURATION OF BOTTOM DELAY

DURATION OF TOP DELAY < DURATION OF BOTTOM DELAY

PROGRAMMABLE DUTY-CYCLE GENERATOR

BACKGROUND OF THE INVENTION

1. Field of the Invention

The present invention relates to the adjustment of duty cycles, and, in particular, to a programmable duty-cycle generator.

2. Description of the Related Art

In the context of circuits, a duty cycle is the ratio of time that a signal is high in relation to the time that the signal is low. In digital circuitry, including most computers, a clock signal is used to coordinate various actions within one or more circuits. The clock signal oscillates between a high and a low state and is usually a square wave having a 50% duty cycle. The circuits using the clock signal for synchronization may become active at either the rising edge, the falling edge, or both edges of the clock signal. As the clock signal traverses a path, its duty cycle may distort and require adjustment.

Duty-cycle adjustment at high speeds is frequently required in a variety of modern applications. For example, a memory component might require a particular duty cycle to allow for pre-charge time before being able to store information. Such high-speed duty-cycle adjustment is typically performed by an analog duty-cycle correction circuit that uses one or more operational amplifiers to try to force the common-mode duty cycle to 50% by comparison to a reference signal. If the common-mode duty cycle does not match the reference signal, then the current load is rapidly increased or decreased, usually consuming much power in the process. Analog circuits that adjust duty cycles to fixed values other than 50% consume even more power and suffer other disadvantages characteristic of analog circuitry, as well as lacking programmability of the desired duty cycle value.

SUMMARY OF THE INVENTION

Problems in the prior art are addressed in accordance with the principles of the present invention by providing a programmable duty-cycle generator that uses digital logic gates to effect adjustment of the duty cycle of an input clock signal.

In one embodiment, a duty-cycle generator includes a duty-cycle adjustment circuit and a delay processor. The duty-cycle adjustment circuit is adapted to receive an input clock signal having an input duty cycle, generate first and second versions of the input clock signal having different amounts of delay, and combine the first and second versions of the input clock signal to generate an output clock signal having an output duty cycle different from the input duty cycle. The delay processor is adapted to generate at least one control signal for controlling operations of the duty-cycle adjustment circuit based on a comparison of a characteristic of the output clock signal with a corresponding characteristic of a target output clock signal.

In another embodiment, a method for generating a duty cycle includes: receiving an input clock signal having an input duty cycle; generating first and second versions of the input clock signal having different amounts of delay; combining the first and second versions of the input clock signal to generate an output clock signal having an output duty cycle different from the input duty cycle; and generating at least one control signal for controlling operations of the duty-cycle adjustment circuit based on a comparison of a characteristic of the output clock signal with a corresponding characteristic of a target output clock signal.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
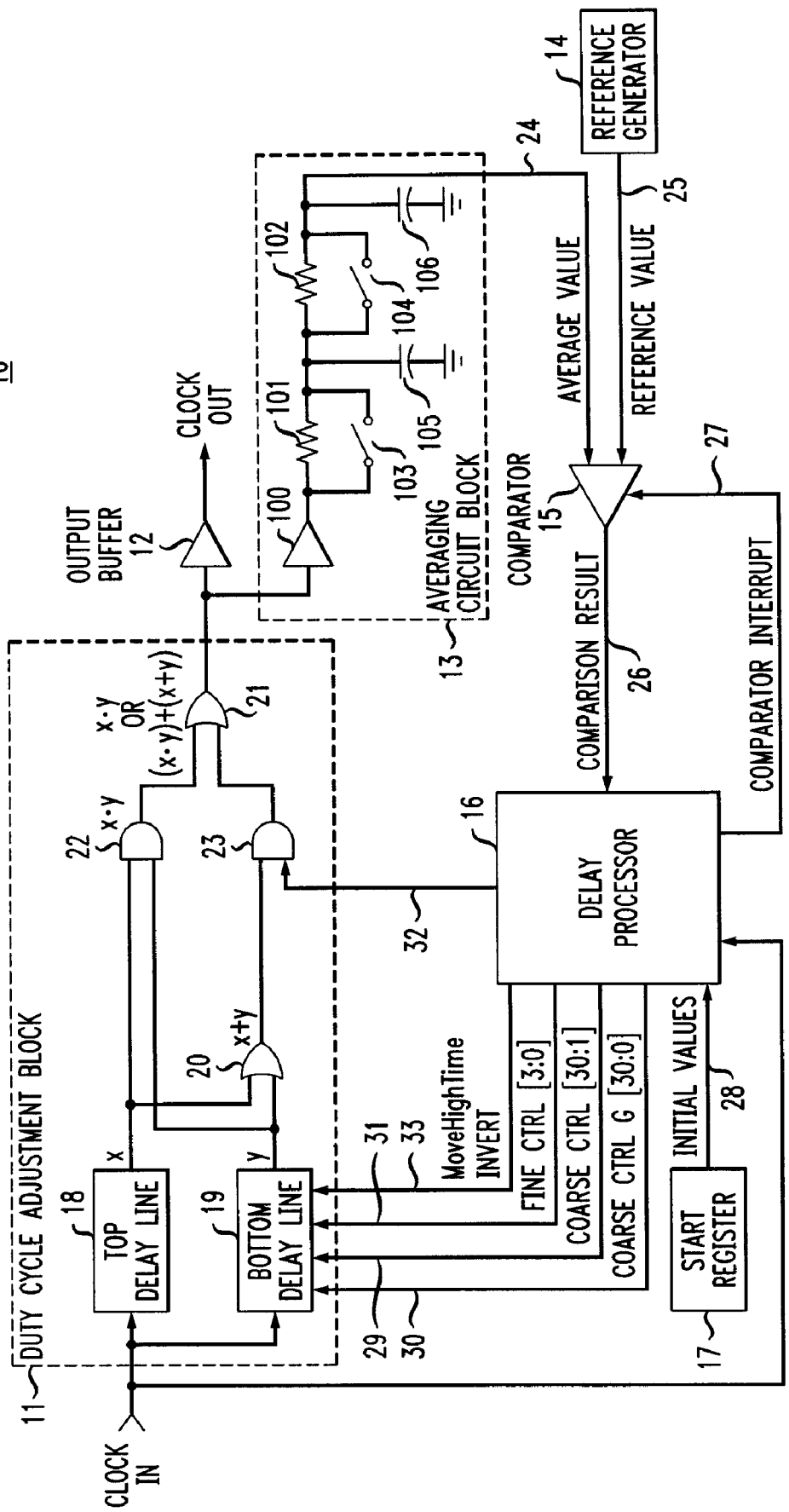
FIG. 1 is a block diagram illustrating an exemplary programmable duty-cycle generator consistent with one embodiment of the present invention.

FIG. 1 illustrates an exemplary programmable duty-cycle generator 10 consistent with one embodiment of the present invention. As shown, duty-cycle generator 10 comprises a duty-cycle adjustment block 11, an output buffer 12, an averaging circuit block 13, a reference generator 14, a low-power comparator 15, a delay processor 16, and a start register 17.

Duty-cycle adjustment block 11 comprises a top delay line 18, a bottom delay line 19, OR gates 20 and 21, and AND gates 22 and 23. Duty-cycle adjustment block 11 receives an input signal Clock In from a clock (not shown) whose duty cycle is to be adjusted and provides an output clock signal to output buffer 12 and to averaging circuit block 13. Averaging circuit block 13 continuously (or over a predefined time period) averages the output clock signal and provides the determined average value 24 to comparator 15. Reference generator 14 provides a reference value 25 to comparator 15, which comparator 15 compares with average value 24 from averaging circuit block 13. Comparator 15 outputs a comparison result signal 26 to delay processor 16 in the form of a binary value, to indicate whether average value 24 from averaging circuit block 13 is greater than or less than reference value 25 provided by reference generator 14. For example, if average value 24 is greater than reference value 25, then the value of comparison result signal 26 is "1"; otherwise, the value of comparison result signal 26 is "0". Delay processor 16 selectively asserts and provides to comparator 15 a comparator-interrupt signal 27 to control whether comparator 15 is active or inactive, e.g., in order to reduce power consumption. Initially, delay processor 16 receives one or more default values 28 from start register 17 for setting the duty cycle, to hasten the initial "locking" process (as will be described in further detail below), after which delay processor 16 provides one or more control signals (29, 30, 31, 32, 33) to duty-cycle adjustment block 11 to adjust the duty cycle.

Figure 2:
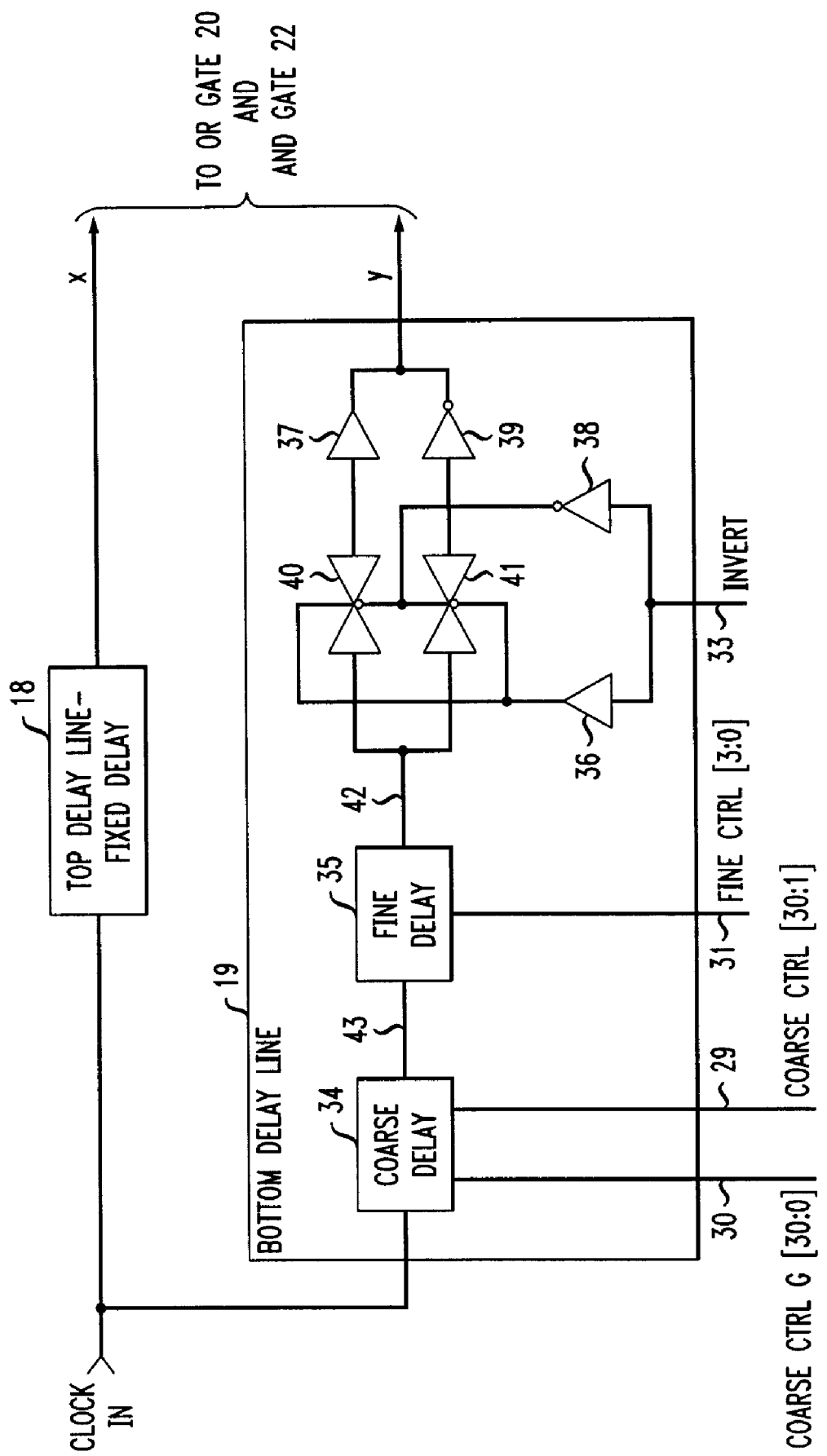
FIG. 2 is a block diagram showing the arrangement of exemplary top and bottom delay lines in the embodiment of FIG. 1.

FIG. 2 is a block diagram of top delay line 18 and bottom delay line 19 of duty-cycle adjustment block 11 of FIG. 1. Each delay line 18, 19 is a circuit designed to introduce a specific time delay into the transmission of signal Clock In. In this embodiment, top delay line 18 has a preselected fixed delay duration, although, in other embodiments, top delay line 18 could have a variable, programmable delay duration. Bottom delay line 19 comprises a coarse delay block 34, a fine delay block 35, buffers 36 and 37, inverters 38 and 39, and transmission gates 40 and 41.

Both delay lines 18, 19 receive signal Clock In. Depending on the preselected fixed delay duration, top delay line 18 outputs a possibly-delayed version x of signal Clock In. Bottom delay line 19 outputs a possibly-delayed version y of signal Clock In.

Coarse delay block 34 receives from delay processor 16 control signals CoarseCtrl[30:1] 29 and CoarseCtrlG[30:0] 30, the combination of which may be used to modify the delay duration of coarse delay block 34. Based on control signals CoarseCtrl[30:1] and CoarseCtrlG[30:0], coarse delay block 34 provides to fine delay block 35 a possibly-delayed version of signal Clock In as clock signal 43.

Fine delay block 35 receives from delay processor 16 of FIG. 1 control signal FineCtrl[3:0] 31, which may be used to modify the delay duration of fine delay block 35. Based on control signal FineCtrl[3:0], fine delay block 35 provides as signal 42 a possibly-delayed version of clock signal 43.

Based on control signal Invert 33, signal 42 may or may not become inverted. As is known in the art, each transmission gate 40, 41 is open (i.e., preventing an input signal from passing through) unless and until one of its control inputs receives a control signal that is the inverse of a control signal received at its other control input, at which point the transmission gate is closed (i.e., permitting an input signal to pass through). Control signal Invert is provided via buffer 36 to the top control input (as shown in FIG. 2) of transmission gate 40 and the bottom control input of transmission gate 41, and the inverse of control signal Invert is provided via inverter 38 to the bottom control input of transmission gate 40 and the top control input of transmission gate 41. Thus, if Invert is low, then signal 42 is provided to buffer 37, which outputs signal 42 as signal y. If Invert is high, then signal 42 is provided to inverter 39, which outputs an inverted version of signal 42 as signal y.

Figure 3:
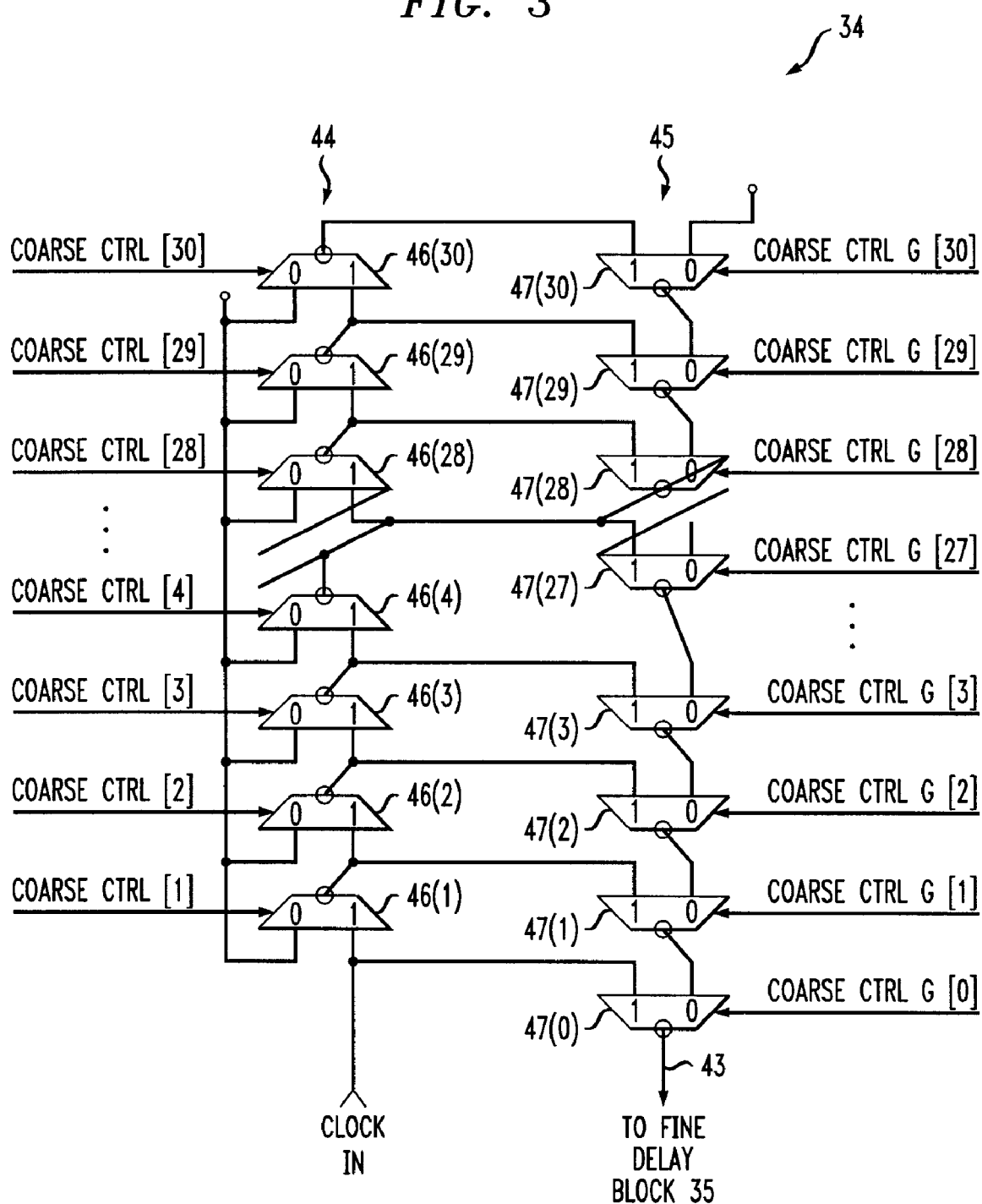
FIG. 3 is a schematic diagram of the coarse delay block of FIG. 2.

FIG. 3 is a schematic diagram of coarse delay block 34 of FIG. 1. While, in FIG. 3, only seven multiplexers (muxes) of a first stage 44 and eight muxes of a second stage 45 are actually shown, coarse delay block 34 comprises a total of 61 muxes arranged in these two stages 44, 45.

In first stage 44, 30 first-stage muxes are identified as muxes 46(1) to 46(30). In second stage 45, 31 second-stage muxes are identified as muxes 47(0) to 47(30). Each of muxes 46(1)-46(30), 47(0)-47(30) is an inverting 2:1 mux, which provides as its output an inverted version of one of its two inputs, with the input selected by a 1-bit control signal applied to the control input of each mux. If the control signal has a 0 value, then the "0" input signal is selected. If the control signal has a 1 value, then the "1" input signal is selected.

In first stage 44, the "0" inputs of muxes 46(1)-46(30) are all coupled to a "floating" output not connected to any other component. The "1" input of mux 46(1) receives signal Clock In. The output of each mux 46(i) of first-stage muxes 46(1)-46(29) is coupled to the "1" input of successive mux 46(i+1). The output of mux 46(30) is coupled to the "1" input of second-stage mux 47(30). Each first-stage mux 46(i) receives a respective 1-bit control signal CoarseCtrl[i] from delay processor 16 (of FIG. 1).

In second stage 45, the "0" input of each mux 47(j) of second-stage muxes 47(0)-47(29) is coupled to the output of previous mux 47(j+1). The "0" input of mux 47(30) is coupled to a "floating" output not connected to any other component. The "1" input of each mux 47(k) of second-stage muxes 47(1)-47(30) is coupled to the output of a corresponding first-stage mux 46(k). The "1" input of mux 47(0) is coupled to signal Clock In, and the output of mux 47(0) is provided to fine delay block 35 (of FIG. 2) as signal 43. Each second-stage mux 47(j) receives a respective 1-bit control signal CoarseCtrlG[j] from delay processor 16 (of FIG. 1).

Coarse delay control is effected by signals CoarseCtrl[i] and CoarseCtrlG[j], as follows.

To provide a baseline level of coarse delay (i.e., zero steps of coarse delay), only CoarseCtrlG[0] is asserted, with all remaining CoarseCtrl and CoarseCtrlG signals deasserted, causing mux 47(0) to output signal 43 as a minimally-delayed, inverted version of signal Clock In.

Providing n steps (e.g., 100ps each) of coarse delay (where $1 \leq n \leq 30$) is effected by asserting CoarseCtrl[n:1] and CoarseCtrlG[n] and deasserting the remaining CoarseCtrl and CoarseCtrlG control signals, causing each mux pair 46(i), 47(i), for ($1 \leq i \leq n$) to serve as a delay element.

For example, to provide one step of coarse delay, CoarseCtrl[1] and CoarseCtrlG[1] are asserted, with all remaining CoarseCtrl and CoarseCtrlG signals deasserted, causing signal Clock In to pass through the "1" input of mux 46(1), with the output of mux 46(1) provided to the "1" input of mux 47(1), and the output of mux 47(1) provided to the "0" input of mux 47(0), which outputs as signal 43 an inverted version of signal Clock In having one step of coarse delay. This one step of coarse delay is effected by forcing the Clock In signal to travel a distance that is determined by routing via one mux pair (46(1), 47(1)) and 47(0) and to be thrice inverted by the same mux pair (46(1), 47(1)) and 47(0).

To provide two steps of coarse delay, CoarseCtrl[2:1] and CoarseCtrlG[2] are asserted, with all remaining CoarseCtrl and CoarseCtrlG signals deasserted, causing signal Clock In to pass through the "1"input of mux 46(1), with the output of mux 46(1) provided to the "1" input of mux 46(2), the output of mux 46(2) provided to the "1" input of mux 47(2), the output of mux 47(2) provided to the "0" input of mux 47(1), and the output of mux 47(1) provided to the "0" input of mux 47(0), which outputs as signal 43 an inverted version of signal Clock In having two steps of coarse delay. These two steps of coarse delay are effected by forcing the Clock In signal to travel a distance that is determined by routing via two mux pairs (46(1), 47(1) and 46(2), 47(2)) and 47(0) and to be inverted five times by the same two mux pairs (46(1), 47(1) and 46(2), 47(2)) and 47(0).

Providing 3 to 30 steps of coarse delay is effected in like manner.

It should be understood that other numbers and arrangements of muxes are possible in alternative embodiments, and that the invention is not limited to the coarse delay block shown in FIG. 3. Other types of delay elements, cells, and circuits may alternatively or additionally be used to effect coarse delay control.

Figure 4:
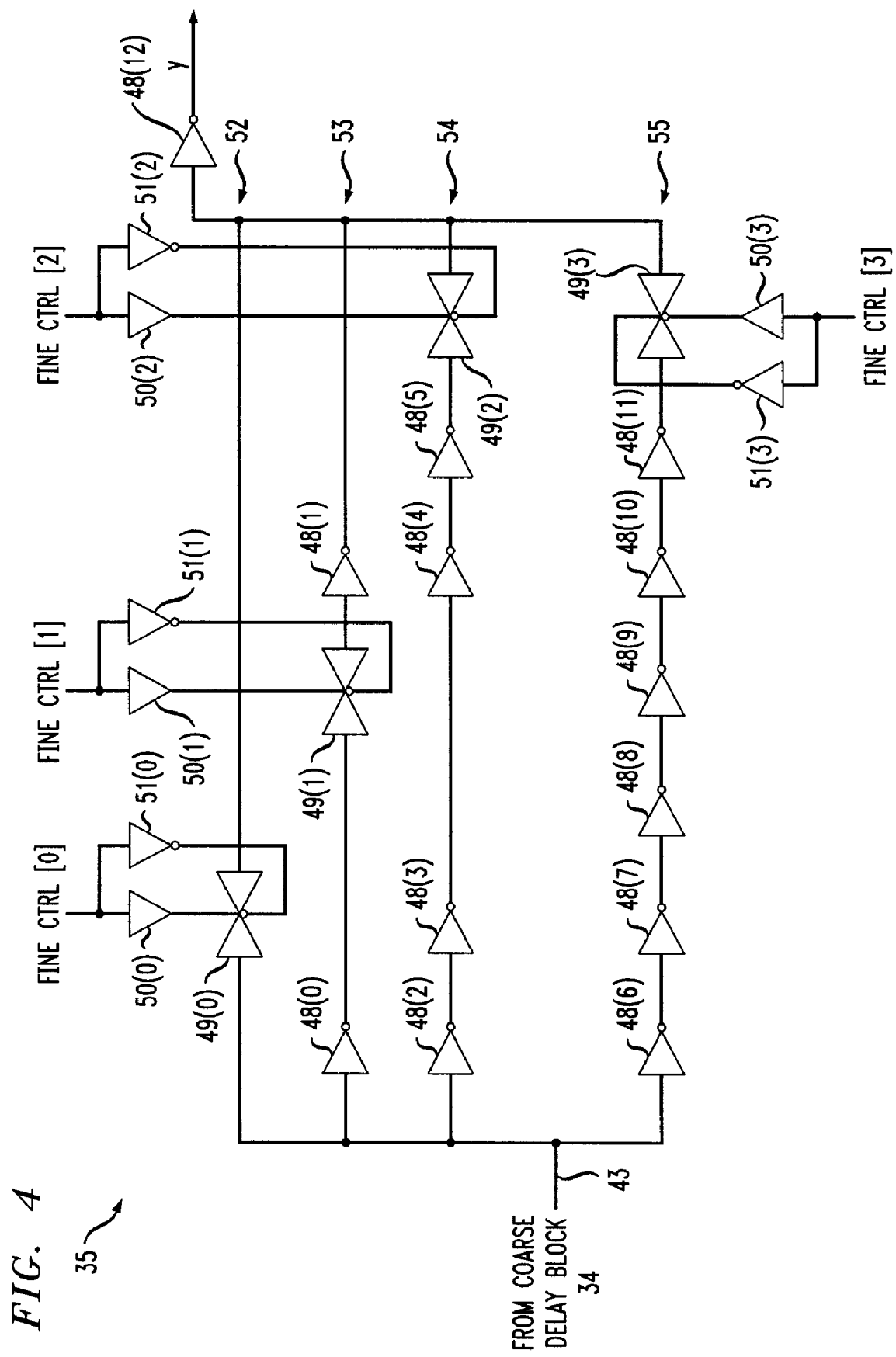
FIG. 4 is a schematic diagram of the exemplary fine delay block of FIG. 2.

FIG. 4 is a schematic diagram of fine delay block 35 of FIG. 2. Fine delay block 35 comprises 12 inverters 48 and 4 transmission gates 49 arranged in four rows 52, 53, 54, and 55. One end of each row 52, 53, 54, 55 is coupled to signal 43 from coarse delay block 34, and the other end of each row 52, 53, 54, 55 is coupled to an inverter 48(12).

Signal FineCtrl[3:0] is provided by delay processor 16 of FIG. 1. First row 52 comprises only a transmission gate 49(0) controlled by signal FineCtrl[0], which is provided to one control input of transmission gate 49(0) via buffer 50(0), and the inverse of which is provided to the other control input of transmission gate 49(0) via inverter 51(0). Second row 53 comprises inverters 48(0) and 48(1) and transmission gate 49(1) controlled by signal FineCtrl[1], which is provided to one control input of transmission gate 49(1) via buffer 50(1), and the inverse of which is provided to the other control input of transmission gate 49(1) via inverter 51(1). Third row 54 comprises inverters 48(2), 48(3), 48(4), and 48(5) and transmission gate 49(2) controlled by signal FineCtrl[2], which is provided to one control input of transmission gate 49(2) via buffer 50(2), and the inverse of which is provided to the other control input of transmission gate 49(2) via inverter 51(2). Fourth row 55 comprises inverters 48(6), 48(7), 48(8), 48(9), 48(10), and 48(11) and transmission gate 49(3) controlled by signal FineCtrl[3], which is provided to one control input of transmission gate 49(3) via buffer 50(3), and the inverse of which is provided to the other control input of transmission gate 49(3) via inverter 51(3).

Providing n steps (e.g., 25 each) of fine delay (where $0 \leq n \leq 3$) is effected by asserting FineCtrl[n] and deasserting the remaining FineCtrl signals. For example, to provide a baseline level of fine delay (i.e., zero steps of fine delay), signal FineCtrl[0] is asserted, and signals FineCtrl[1:3] are deasserted, causing only transmission gate 49(0) to close, thereby permitting signal 43 to be provided directly to inverter 48(12), which outputs as signal y a minimally-delayed, inverted version of signal 43.

As another example, to provide one step (e.g., 25) of fine delay, signal FineCtrl[1] is asserted, and signals FineCtrl[0, 2:3] are deasserted, causing only transmission gate 49(1) to close, thereby permitting signal 43 to be provided to and inverted by inverter 48(0), which provides its output signal to inverter 48(1). The output of inverter 48(1) is provided to inverter 48(12), which outputs as signal y an inverted version of signal 43 having one step of fine delay. This one step of fine delay is effected by forcing signal 43 to travel a distance that is determined by routing via inverters 48(0) and 48(1).

Two and three steps of fine delay are effected in like manner, by routing signal 43 via rows 54 and 55, respectively.

It should be noted that, in coarse block 34, signal Clock In is inverted an odd number of times by the various muxes, resulting in a potentially-delayed and inverted version of signal Clock In. Subsequently, in fine block 35, signal 43 is inverted an odd number of times by the various inverters, resulting in a potentially-delayed, but non-inverted version of signal Clock In. It should be understood that other numbers and arrangements of inverters and transmission gates are possible in alternative embodiments, and that the invention is not limited to the fine delay block shown in FIG. 4. Other types of delay elements, cells, and circuits may alternatively or additionally be used to effect fine delay control.

Returning now to FIG. 1, output signals x, y of top delay line 18 and bottom delay line 19 are provided to a set of digital logic gates, which collectively output a possibly duty-cycle-adjusted clock signal, as follows: Signals x and y are received by (i) OR gate 20, which provides to AND gate 23 a signal representing x+y, and (ii) AND gate 22, which provides to OR gate 21 a signal representing x·y. AND gate 23 receives a MoreHighTime signal 32 from delay processor 16. If MoreHighTime signal 32 is low, then AND gate 23 provides a value of zero (i.e., 0·(x+y)) to OR gate 21. If MoreHighTime signal 32 is high, then AND gate 23 provides a value of x+y (i.e., 1·(x+y)) to OR gate 21. Thus, OR gate 21 will either output x·y (if MoreHighTime 32 is low) or (x·y)+(x+y) (if MoreHighTime 32 is high). The output of OR gate 21 is provided to output buffer 12, which outputs a potentially duty-cycle-adjusted clock signal Clock Out. The output of OR gate 21 is also provided to buffer 100 (e.g., an operational amplifier) of averaging circuit block 13.

Figure 5:
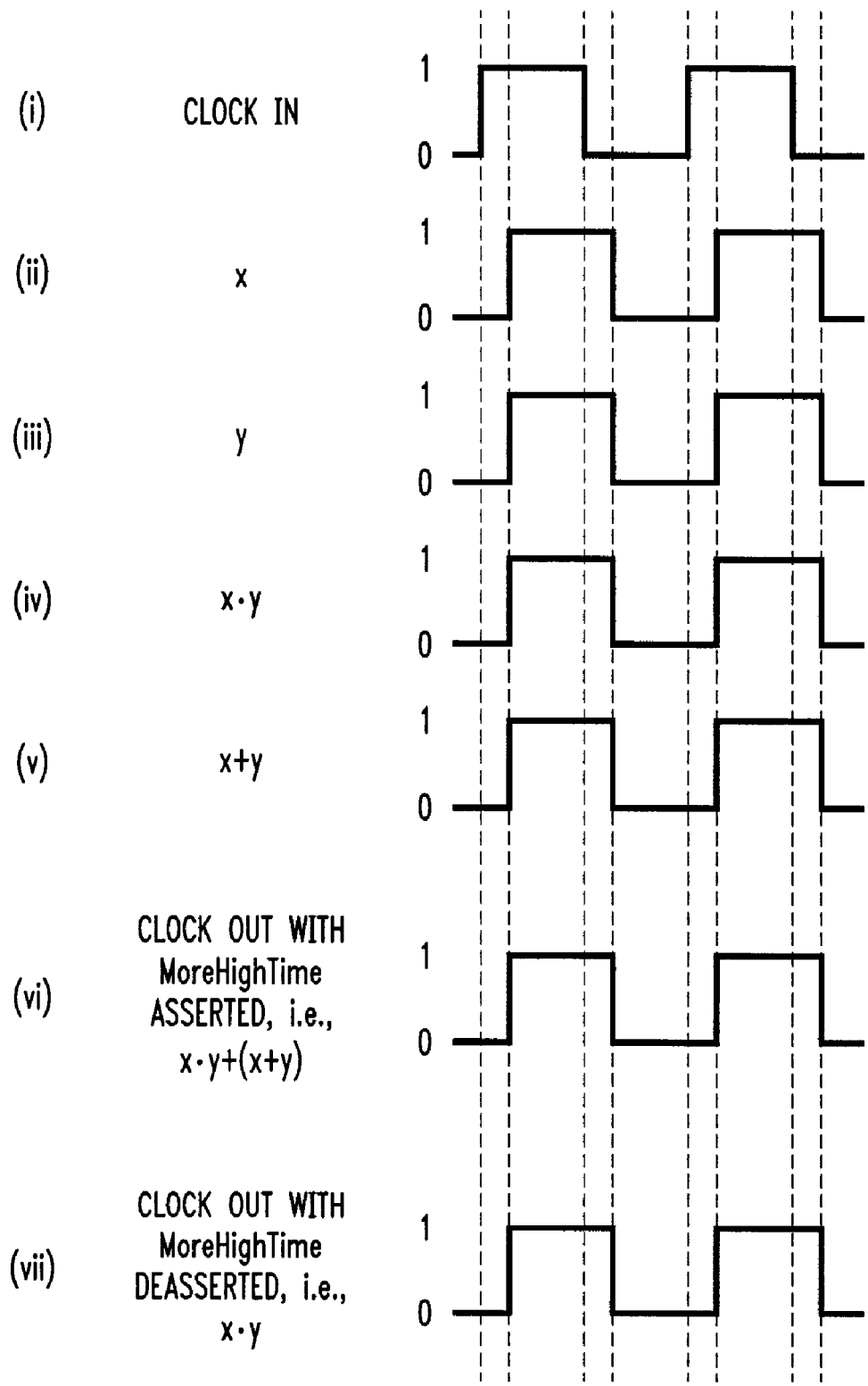
FIG. 5 is a timing diagram illustrating a set of output waveforms for the scenario in which the durations of the top delay line and the bottom delay line are equal.
Figure 6:
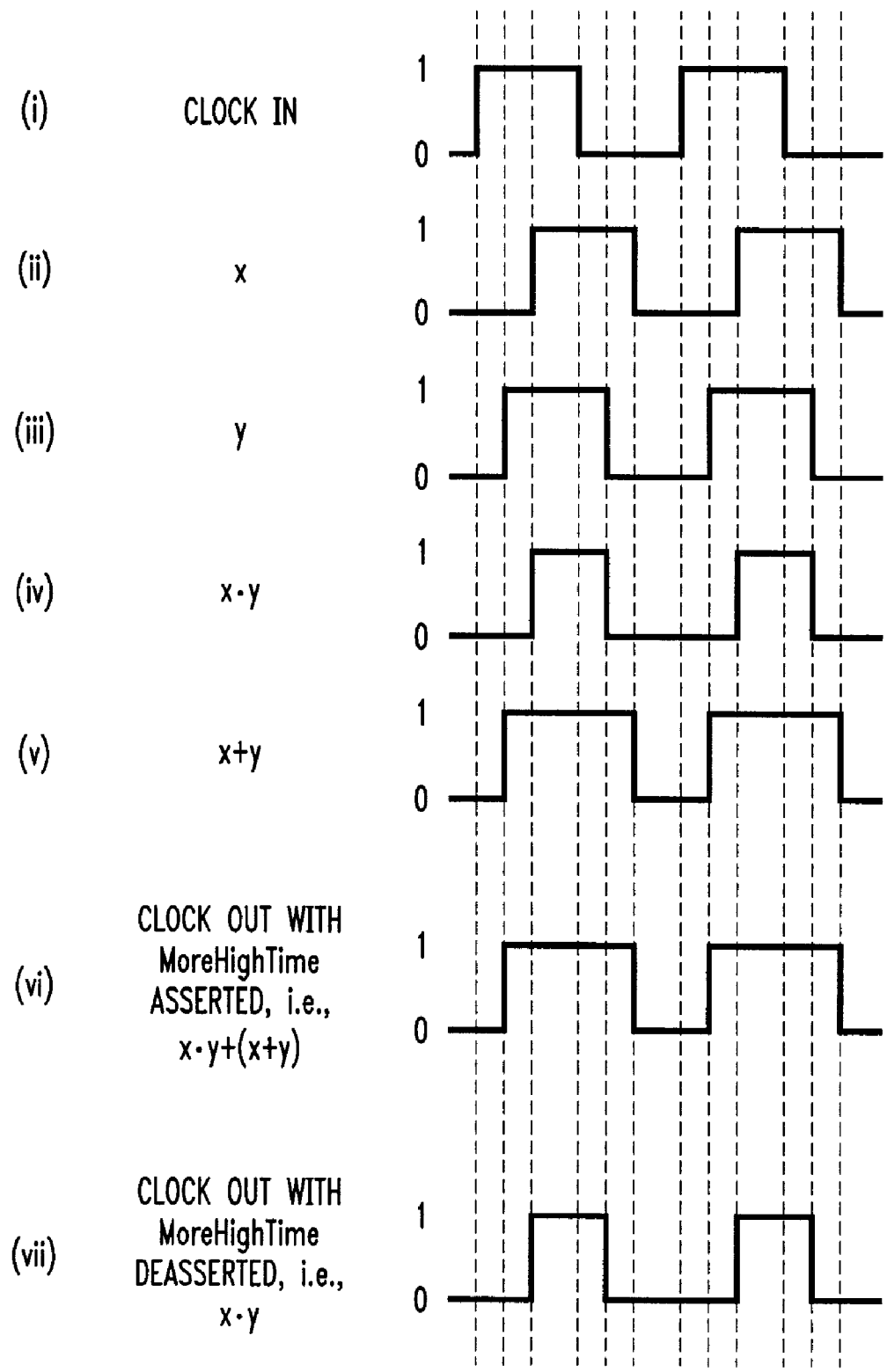
FIG. 6 is a timing diagram illustrating a set of output waveforms for the scenario in which the top delay line has a duration greater than that of the bottom delay line.
Figure 7:
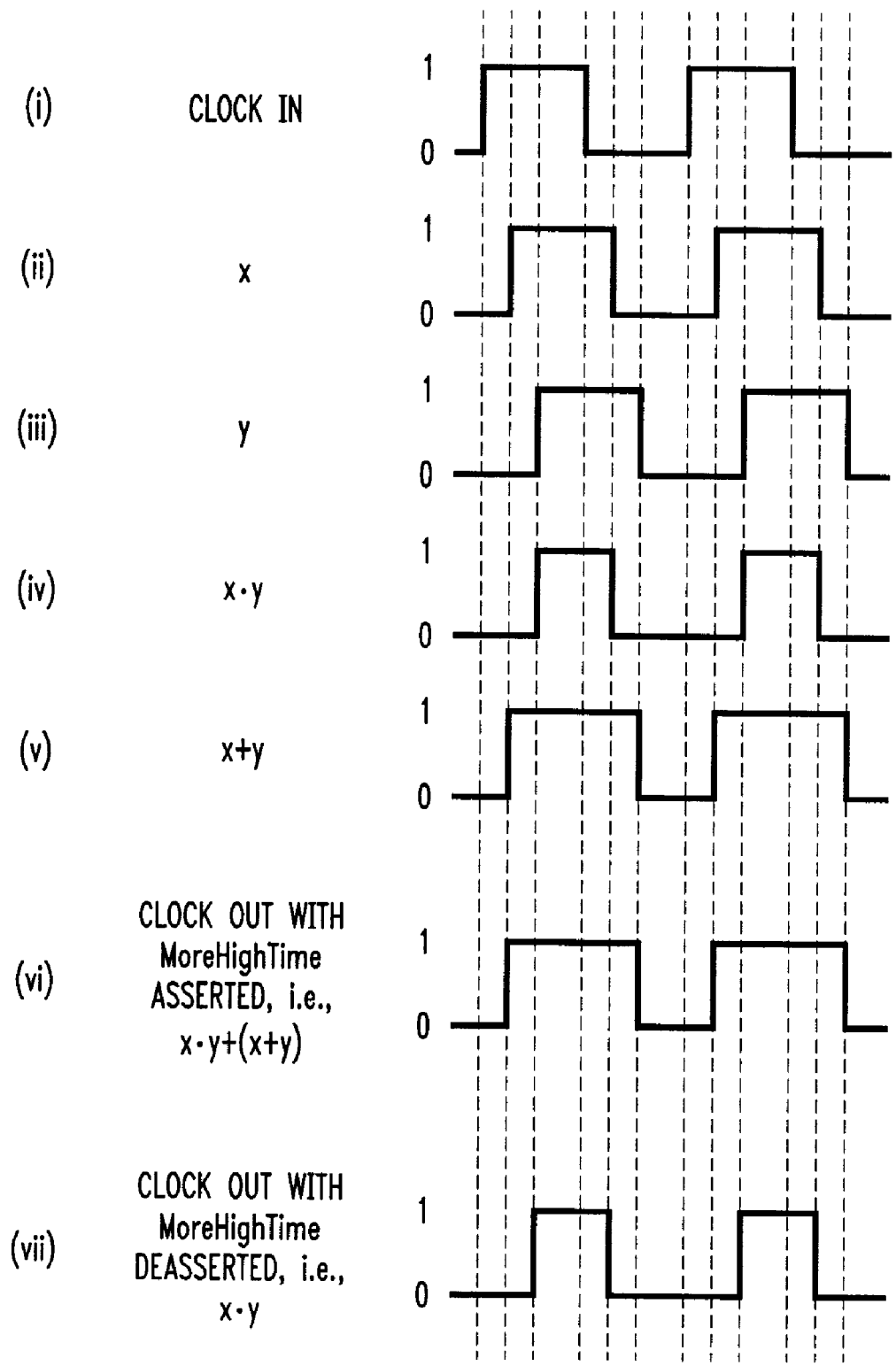
FIG. 7 is a timing diagram illustrating a set of output waveforms for the scenario in which the top delay line has a duration less than that of the bottom delay line.

With reference now to FIGS. 5, 6, and 7, waveforms in three different scenarios, respectively, are illustrated. For each of these scenarios, waveforms are shown that represent: (i) the output x of top delay line 18, (ii) the output y of bottom delay line 19, (iii) the output x·y of AND gate 22, (iv) the output x+y of OR gate 20, (v) the output of OR gate 21 ((x·y)+(x+y)) when MoreHighTime signal 32 is asserted, and (vi) the output of OR gate 21 (x·y) when MoreHighTime signal 32 is deasserted. It is noted that, since x and y are merely potentially-delayed versions of signal Clock In, the duty cycles of x and y are the same as that of signal Clock In.

FIG. 5 illustrates a first scenario, in which waveforms (i) through (vi) are shown for the case in which the durations of top delay line 18 and bottom delay line 19 are equal. As shown in FIG. 5, when the durations of top delay line 18 and bottom delay line 19 are the same, the waveforms for x, y, x·y, x+y, and (x·y)+(x+y) are identical, and hence, the waveforms for Clock In and Clock Out are also identical, i.e., no adjustment of the duty cycle is introduced into the Clock In signal.

FIG. 6 illustrates a second scenario, in which waveforms (i) through (vi) are shown for the case in which top delay line 18 has a duration greater than that of bottom delay line 19. As shown in FIG. 6, when the duration of top delay line 18 is greater than the duration of bottom delay line 19, the resulting waveform for x·y has a smaller duty cycle than the waveform for signal Clock In, and the resulting waveform for x+y has a larger duty cycle than the waveform for signal Clock In. Accordingly, when MoreHighTime signal 32 is asserted, the Clock Out signal embodies the same waveform as the waveform for x+y, which has a larger duty cycle than signal Clock In, thereby providing a Clock Out signal having an increased duty cycle. When MoreHighTime signal 32 is deasserted, the Clock Out signal embodies the same waveform as the waveform for x·y, which has a smaller duty cycle than the Clock In signal, thereby providing a Clock Out signal having a reduced duty cycle.

FIG. 7 illustrates a third scenario, in which waveforms (i) through (vi) are shown for the case in which top delay line 18 has a duration less than that of bottom delay line 19. As shown in FIG. 7, when the duration of top delay line 18 is less than the duration of bottom delay line 19, the resulting waveform for x·y has a smaller duty cycle than the waveform for signal Clock In, and the resulting waveform for x+y has a larger duty cycle than the waveform for signal Clock In. Accordingly, when MoreHighTime signal 32 is asserted, the Clock Out signal embodies the same waveform as the waveform for x+y, which has a larger duty cycle than the Clock In signal, thereby providing a Clock Out signal having an increased duty cycle. When MoreHighTime signal 32 is deasserted, the Clock Out signal embodies the same waveform as the waveform for x·y, which has a smaller duty cycle than the Clock In signal, thereby providing a Clock Out signal having a reduced duty cycle.

From FIGS. 6 and 7, it can be seen that the delay duration of bottom delay line 19 may be increased or decreased to influence the adjustment of the duty cycle introduced into the Clock In signal. It is the magnitude of the relative difference between the durations of top delay line 18 and bottom delay line 19 that controls the magnitude of the duty-cycle adjustment to the Clock In signal by duty-cycle adjustment block 11, and it is the state of MoreHighTime signal 32 that controls whether the adjustment is an increased duty cycle or a reduced duty cycle.

It should be recognized that other circuits, control signals, and/or methods could alternatively or additionally be used to control the operation of duty-cycle adjustment block 11.

Averaging circuit block 13 is used to generate average value 24. Averaging circuit block 13 comprises buffer 100, resistors 101 and 102, switches 103 and 104, and capacitors 105 and 106 connected to ground. The components of averaging circuit block 13 are configured as follows. Buffer 100 receives a signal from OR gate 21 that constitutes the input of averaging circuit 13. The output of buffer 100 is connected to one end of resistor 101. The other end of resistor 101 is connected to one side of capacitor 105 and to one end of resistor 102. The other end of resistor 102 is connected to one side of capacitor 106 and also constitutes the output of averaging circuit block 13. The other sides of capacitors 105 and 106 are connected to circuit ground. Switch 103 is connected so that, when closed, a short circuit is provided across resistor 101. Switch 104 is connected so that, when closed, a short circuit is provided across resistor 102. Averaging circuit block 13 uses an RC network-based time constant to provide a DC signal 24 proportional to and representing the average value of the Clock Out signal. In this embodiment, averaging circuit block 13 includes two stages, the first stage including resistor 101 and capacitor 105, and the second stage including resistor 102 and capacitor 106. Buffer 100 (e.g., an operational amplifier) supplies its output to capacitors 105 and 106 through resistors 101 and 102. Switches 104 and 103, which may be controlled, e.g., by one or more signals from a controller (not shown), begin in a closed position to speed up the averaging process by permitting the output of buffer 100 to bypass resistors 101 and 102 and to be provided directly to capacitors 105 and 106, and are opened after a predetermined number of clock cycles after averaging circuit block 13 is powered up, after which time these switches remain open. Over time, capacitor 106 will charge to the average voltage level received by buffer 100. This average voltage level is output as average value 24.

For a desired duty cycle, reference generator 14 provides reference value 25 for a desired duty cycle, which is compared by comparator 15 with average value 24 provided by averaging circuit block 13. This reference value is user-selectable and may be provided, e.g., using a resistor ladder or other circuit that permits the user to select the reference value. For example, if Clock In has an amplitude of 1V, a 50% duty cycle for Clock Out is selected by setting reference value 25 to 500 mV. If a 60% duty cycle is desired for Clock Out, the reference value 25 is set to 600 mV, and so forth.

Figure 8:
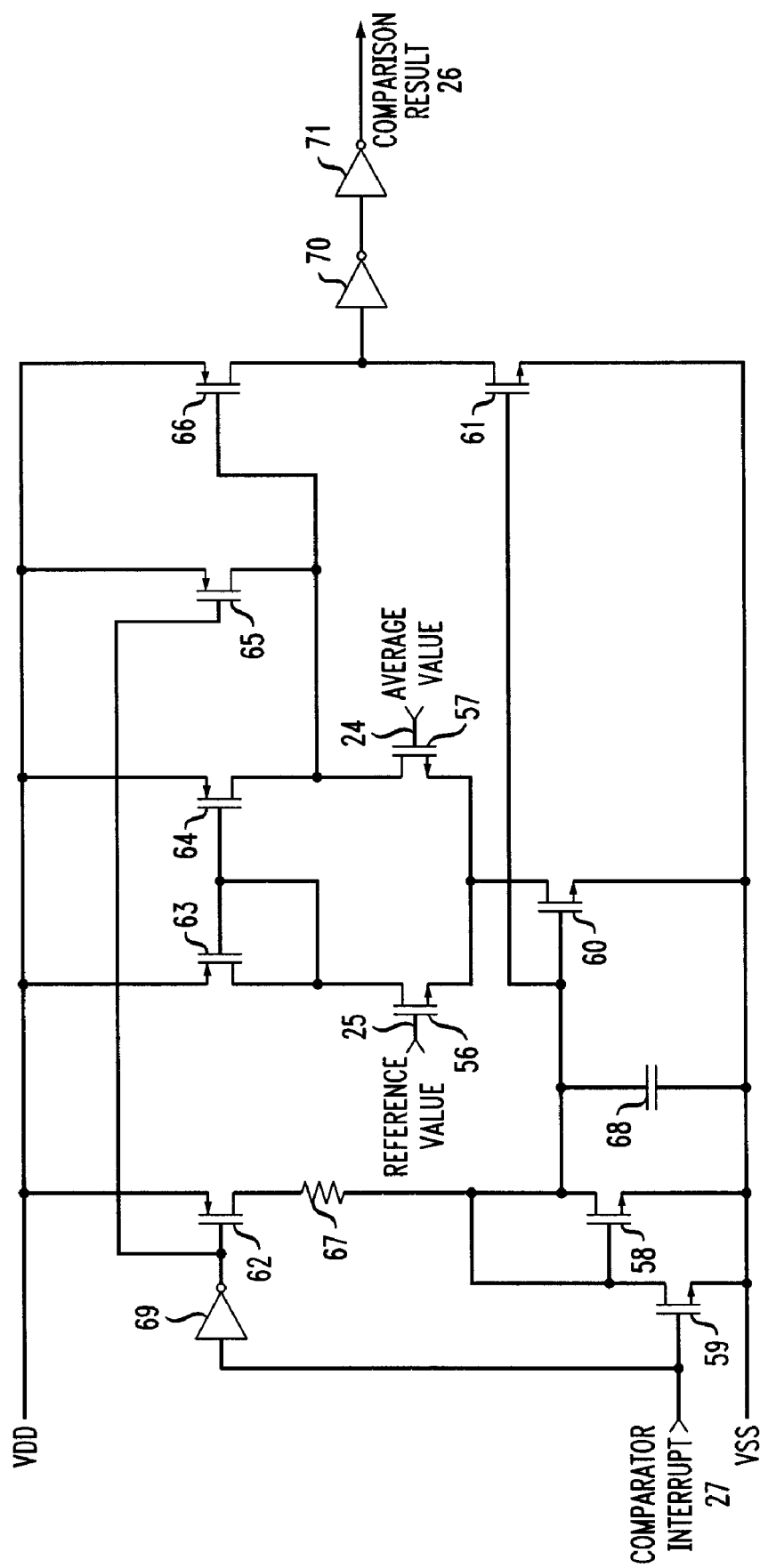
FIG. 8 is a schematic diagram of an exemplary embodiment of the comparator in one embodiment of the invention.

In a preferred embodiment, comparator 15 comprises conventional analog comparator circuitry, such as the circuit shown in FIG. 8. FIG. 8 is a schematic diagram of one exemplary embodiment of comparator 15, which receives and compares average value 24 from averaging circuit block 13 with reference value 25 from reference generator 14 and outputs a "0" if average value 24 is greater than reference value 25 or a "1" if average value 24 is less than reference value 25. As shown, comparator 15 includes p-channel MOSFETs 56, 57, 58, 59, 60, and 61, n-channel MOSFETs 62, 63, 64, 65, and 66, resistor 67, capacitor 68, and inverters 69, 70, and 71. The gate of MOSFET 56 receives reference value 25, and the gate of MOSFET 57 receives average value 24. The sources of MOSFETs 56 and 57 are connected together and to the drain of MOSFET 60. The drain of MOSFET 56 is connected to the gate and the drain of MOSFET 63 and to the gate of MOSFET 64. The drain of MOSFET 57 is connected to the drains of MOSFETs 64 and 65 and to the gate of MOSFET 66. The sources of MOSFETs 62, 63, 64, 65, and 66 are all connected to VDD. The gates of MOSFETs 62 and 65 are connected to each other and to the output of inverter 69. The input of inverter 69 is connected to the comparator interrupt signal 27 input and to the gate of MOSFET 59. The drain of MOSFET 62 is connected to one side of resistor 67, and the other side of resistor 67 is connected to the drain of MOSFET 59, to the gate and drain of MOSFET 58, to the gates of MOSFETs 60 and 61, and to one side of capacitor 68. The other side of capacitor 68 and the sources of MOSFETs 58, 59, 60, and 61 are all connected to VSS. The drains of MOSFETs 61 and 66 are connected together and to the input of inverter 70. The output of inverter 70 is connected to the input of inverter 71, and the output of inverter 71 constitutes the output of comparator 15.

Comparator-interrupt signal 27 is provided by delay processor 16 to power down comparator 15 and is asserted periodically, after a number of clock cycles selected as a function of the time it takes averaging circuit block 13 to provide an accurate average value. If comparator-interrupt signal 27 is deasserted, then the present value of comparison result signal 26 being output by comparator 15 is used by delay processor 16 in controlling duty cycle. However, if comparator-interrupt signal 27 is asserted (i.e., comparator 15 is powered down), then a previous comparison result stored in a flip-flop (not shown) within delay processor 16 is used by delay processor 16 in controlling duty cycle. Accordingly, delay processor 16 is configured with appropriate logic so that, every time comparator-interrupt signal 27 is asserted, the present value of comparison result signal 26 is stored in the flip-flop immediately prior to comparator 15 being powered down. Additional flip-flops (not shown) may be provided (e.g., within delay processor 16) to serve as back-to-back dual metastability flip-flops, to handle the case when the reference and average values are identical, so that additional settling time is provided for reaching a "0" or a "1" comparison result. (It should be understood that, in an alternative embodiment, a reference current value and an average current value could alternatively be compared instead of a reference voltage value and an average voltage value.) Referring again to FIG. 1, delay processor 16 provides duty-cycle adjustment block 11 with signals CoarseCtrl 29, CoarseCtrlG 30, FineCtrl 31, Invert 33, and MoreHighTime 32, which are initially generated based on default values received from start register 17 and the Clock In signal and are subsequently adapted based on the "0" or "1" signals received from comparator 15. As explained above with reference to FIGS. 5, 6, and 7, if the durations of the top and bottom delay lines are not identical, when the MoreHighTime signal 32 is asserted, duty-cycle adjustment block 11 increases the duty cycle of the Clock Out signal, and when the MoreHighTime signal 32 is not asserted, duty-cycle adjustment block 11 decreases the duty cycle of the Clock Out signal. CoarseCtrl [30:1] 29, CoarseCtrlG[30:0]30, and FineCtrl[3:0]31 signals are multi-bit signals used to provide precise control over the duration of delay introduced by bottom delay line 19, and Invert is a binary signal used to invert the output of bottom delay line 19.

Figure 9:
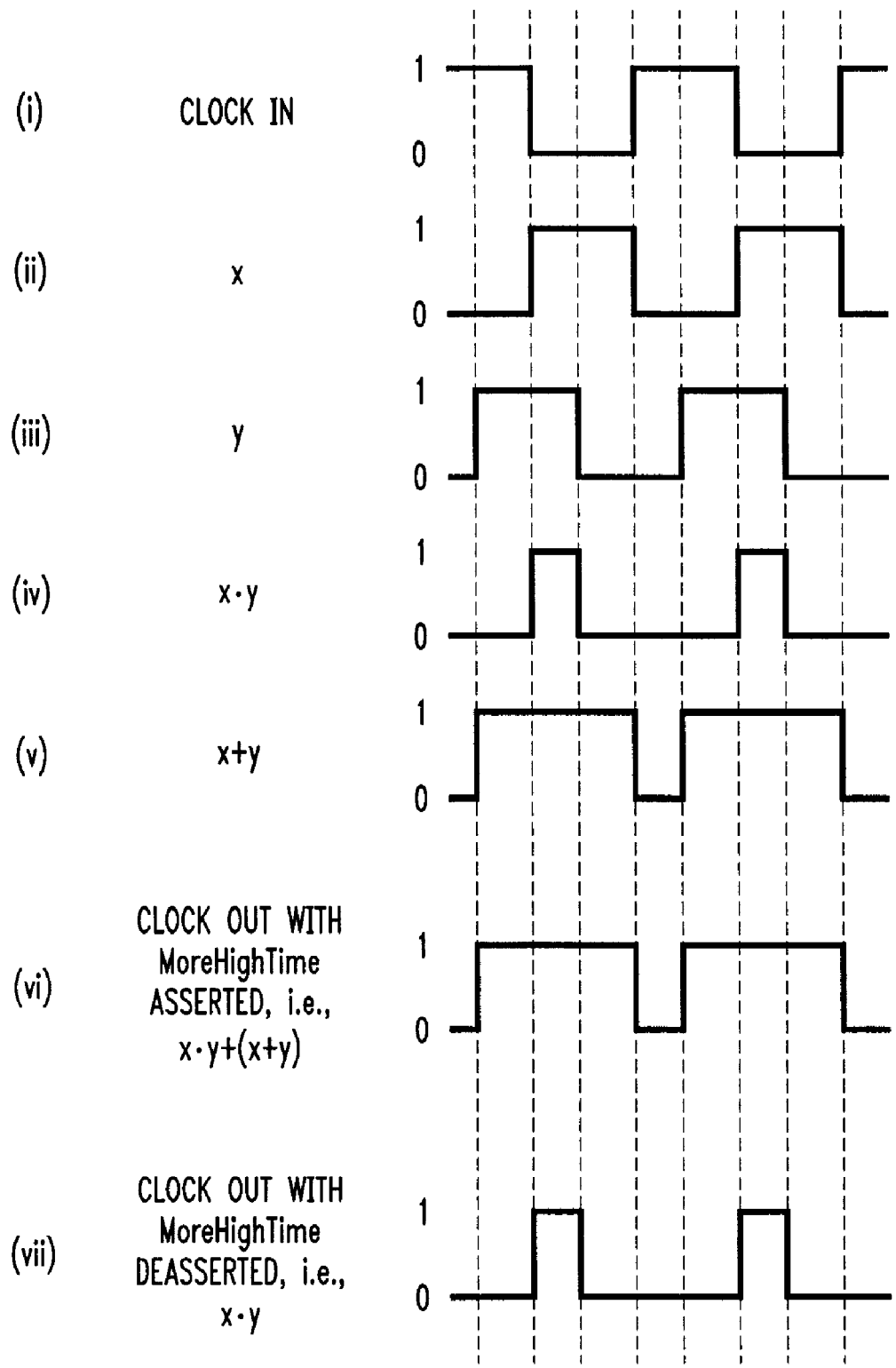
FIG. 9 is a timing diagram illustrating a set of output waveforms at the start of execution of the algorithm.

Delay processor 16 uses a delay-update algorithm, such as the following exemplary algorithm, wherein it is assumed that one fine delay step in delay line 19 has a given minimum delay (e.g., 25 ps), and the delay duration of one coarse delay step is equal to the delay duration of 4 fine delay cells (e.g., 100 ps):

Step 1. The algorithm begins by reading initial values 28 from start register 17. In this embodiment, initial values 28 are preprogrammed so that bottom delay line 19 is initially set to 15 steps of coarse delay (i.e., "delay center," which equals 15 out of 30, or ½, of the maximum available coarse delay steps) and 0 steps of fine delay. FIG. 9 shows this scenario, i.e., the duration of bottom delay 19 is ½ of the duration of top delay 18. To achieve this, signals CoarseCtrl[15:1], CoarseCtrlG[15], and FineCtrl[O] are asserted, and the remaining CoarseCtrl, CoarseCtrlG, and FineCtrl signals are deasserted. Signal Invert is also deasserted. The present output value of comparison result signal 26 from comparator 15 (i.e., either 0 or 1) is recorded as StoredResult.

Step 2. Next, bottom delay line 19 is set to 14 steps of coarse delay (delay center minus 1 additional coarse step) and 0 steps of fine delay. Accordingly, signals CoarseCtrl[14:1], CoarseCtrlG[14], and FineCtrl[O] are asserted, and the remaining CoarseCtrl, CoarseCtrlG, and FineCtrl signals are deasserted.

Step 3. The present value of comparison result signal 26 from comparator 15 is compared with recorded value StoredResult. If the present value of comparison result signal 26 is the inverse value of StoredResult, then the algorithm proceeds to Step 6. If the present value of comparison result signal 26 is not the inverse value of StoredResult, then bottom delay line 19 is set to 13 steps of coarse delay (delay center minus 2 additional coarse delay steps) and 0 steps of fine delay. Accordingly, signals CoarseCtrl[12:1], CoarseCtrlG[13], and FineCtrl[0] are asserted, and the remaining CoarseCtrl, CoarseCtrlG, and FineCtrl signals are deasserted. Signal Invert remains deasserted.

Step 4. The present value of comparison result signal 26 from comparator 15 is compared with the recorded value StoredResult. If the present value of comparison result signal 26 is the inverse value of StoredResult, then the algorithm proceeds to Step 6. If the present value of comparison result signal 26 is not the inverse value of StoredResult, then bottom delay line 19 is set to 12 steps of coarse delay (delay center minus 3 additional coarse delay steps) and 0 steps of fine delay. Accordingly, signals CoarseCtrl[12:1], CoarseCtrlG[12], and FineCtrl[0] are asserted, and the remaining CoarseCtrl, CoarseCtrlG, and FineCtrl signals are deasserted. Signal Invert remains deasserted.

Step 5. The algorithm continues in like manner, decrementing the coarse delay one step at a time and determining whether signal 26 has inverted until either (i) signal 26 is determined to be the inverse value of StoredResult, in which case the algorithm proceeds to Step 9, or (ii) bottom delay line reaches 0 steps of coarse delay and signal 26 still is not equal to the inverse value of StoredResult, in which case the algorithm proceeds to Step 6.

Step 6. Bottom delay line 19 is set to 14 steps of coarse delay (delay center plus 1 additional coarse step) and 0 steps of fine delay. Accordingly, signals CoarseCtrl[16:1], CoarseCtrlG[16], and FineCtrl[0] are asserted, and the remaining CoarseCtrl, CoarseCtrlG, and FineCtrl signals are deasserted. Signal Invert remains deasserted.

Step 7. The present value of comparison result signal 26 from comparator 15 is compared with recorded value StoredResult. If the present value of comparison result signal 26 is the inverse value of StoredResult, then the algorithm proceeds to Step 9. If the present value of comparison result signal 26 is not the inverse value of StoredResult, then bottom delay line 19 is set to 15 steps of coarse delay (delay center plus 2 additional coarse delay steps) and 0 steps of fine delay. Accordingly, signals CoarseCtrl[17:1], CoarseCtrlG[17], and FineCtrl[0] are asserted, and the remaining CoarseCtrl, CoarseCtrlG, and FineCtrl signals are deasserted. Signal Invert remains deasserted.

Step 8. The algorithm continues in like manner, incrementing the coarse delay one step at a time and determining whether signal 26 has inverted, until either (i) signal 26 is determined to be the inverse value of StoredResult, in which case the algorithm proceeds to Step 9, or (ii) bottom delay line reaches 30 steps of coarse delay and signal 26 still is not equal to the inverse value of StoredResult, in which case the algorithm restarts at Step 1.

Step 9. Signal 26 has now been determined to be the inverse value of StoredResult. If the present value of comparison result signal 26 is equal to 1, then the algorithm proceeds to Step 14. If the present value of comparison result signal 26 is not equal to 1, then signal Invert is now asserted to provide an inverted output signal y, and the algorithm proceeds to Step 10.

Step 10. Bottom delay line 19 is set to 15 steps of coarse delay (delay center) and 0 steps of fine delay. Accordingly, signals CoarseCtrl[15:1], CoarseCtrlG[15], and FineCtrl[0] are asserted, and the remaining CoarseCtrl, CoarseCtrlG, and FineCtrl signals are deasserted. Signal Invert remains asserted.

Step 11. The present value of comparison result signal 26 from comparator 15 is compared with recorded value StoredResult. If the present value of comparison result signal 26 is the inverse value of StoredResult, then the algorithm proceeds to Step 14. If the present value of comparison result signal 26 is not the inverse value of StoredResult, then bottom delay line 19 is set to 14 steps of coarse delay (delay center minus 1 additional coarse delay step) and 0 steps of fine delay. Accordingly, signals CoarseCtrl[14:1], CoarseCtrlG[14], and FineCtrl[0] are asserted, and the remaining CoarseCtrl, CoarseCtrlG, and FineCtrl signals are deasserted. Signal Invert remains asserted.

Step 12. The present value of comparison result signal 26 from comparator 15 is compared with recorded value StoredResult. If the present value of comparison result signal 26 is the inverse value of StoredResult, then the algorithm proceeds to Step 14. If the present value of comparison result signal 26 is not the inverse value of StoredResult, then bottom delay line 19 is set to 13 steps of coarse delay (delay center minus 2 additional coarse delay steps) and 0 steps of fine delay. Accordingly, signals CoarseCtrl[13:1], CoarseCtrlG[13], and FineCtrl[0] are asserted, and the remaining CoarseCtrl, CoarseCtrlG, and FineCtrl signals are deasserted. Signal Invert remains asserted.

Step 13. The algorithm continues in like manner, incrementing the coarse delay one step at a time and determining whether signal 26 has inverted, until either (i) signal 26 is determined to be the inverse value of StoredResult, or (ii) signal 26 is still not determined to be the inverse value of StoredResult, in which case the algorithm restarts at Step 1. Thus, in Steps 1-13, delay processor 16 iteratively sends CoarseCtrl signals to duty-cycle adjustment block 11 using the feedback provided by comparator 15 until an edge transition of the output duty cycle is found, indicating that the adjusted duty cycle is within a coarse increment of that of the duty cycle corresponding to reference value 25. Once the edge transition is found, the algorithm proceeds to Step 14 to modify the fine delay settings.

Step 14. The present value of comparison result signal 26 from comparator 15 is recorded as StoredResult.

Step 15. With CoarseCtrl, CoarseCtrlG, and Invert signals remaining locked (unchanged), bottom delay line is now increased in fine steps. The present value of comparison result signal 26 from comparator 15 is compared with recorded value StoredResult. If the present value of comparison result signal 26 is the inverse value of StoredResult over a predetermined interval or number of iterations (e.g., 5), then the algorithm proceeds to Step 20. If the present value of comparison result signal 26 is not the inverse value of StoredResult over the predetermined interval or number of iterations, then bottom delay line 19 is set to one step of fine delay. Accordingly, signal FineCtrl[1] is asserted.

Step 16. The present value of comparison result signal 26 from comparator 15 is compared with the recorded output StoredResult of comparator 15. If the present value of comparison result signal 26 is the inverse value of StoredResult over the predetermined interval or number of iterations, then the algorithm proceeds to Step 20. If the present value of comparison result signal 26 is not the inverse value of StoredResult over the predetermined interval or number of iterations, then bottom delay line 19 is set to two steps of fine delay. Accordingly, signal FineCtrl[2] is asserted.

Step 17. The algorithm continues in like manner, incrementing the fine delay one step at a time and determining whether signal 26 has inverted, until either (i) signal 26 is determined to be the inverse value of StoredResult over the predetermined interval or number of iterations, in which case the algorithm proceeds to Step 20, or (ii) bottom delay line reaches 4 steps of fine delay (i.e., FineCtrl[4] is asserted) and signal 26 still is not equal to the inverse value of StoredResult over the predetermined interval or number of iterations, in which case the algorithm proceeds to Step 18.

Step 18. With CoarseCtrl, CoarseCtrlG, and Invert signals remaining locked, bottom delay line is now decreased in fine steps (i.e., FineCtrl[3] is asserted). The present value of comparison result signal 26 from comparator 15 is compared with the recorded output StoredResult of comparator 15. If the present value of comparison result signal 26 is the inverse value of StoredResult over the predetermined interval or number of iterations, then the algorithm proceeds to Step 20. If the present value of comparison result signal 26 is not the inverse value of StoredResult over the predetermined interval or number of iterations, then bottom delay line 19 is set to one step less of fine delay (i.e., FineCtrl[2] is asserted).

Step 19. The algorithm continues in like manner, decrementing the fine delay one step at a time and determining whether signal 26 has inverted, until either (i) signal 26 is determined to be the inverse value of StoredResult over the predetermined interval or number of iterations, in which case the algorithm proceeds to Step 20, or (ii) bottom delay line reaches 0 steps of fine delay and signal 26 still is not equal to the inverse value of StoredResult, in which case the algorithm restarts at Step 1.

Step 20. The present value of comparison result signal 26 from comparator 15 is recorded as StoredResult, and the algorithm returns to Step 14.

By continuously repeating Steps 14-20, delay processor 16 iteratively sends modified FineCtrl signals to duty-cycle adjustment block 11 using the feedback provided by comparator 15 in a bang-bang fashion until delay processor 16 determines that the adjusted duty cycle is within a fine increment of that of the duty cycle corresponding to reference value 25. At that point, the delay duration effected by bottom delay line 19 can cease being modified and can remain at the target amount.

In this embodiment, top delay line 18 remains at a fixed delay value, and only bottom delay line 19 has an adjustable delay duration. However, in other embodiments, top delay line 18 might have a duration that is controllable in a similar manner to (and in addition to or instead of) bottom delay line 19 and could alternatively or additionally receive control signals similar to CoarseCtrl, CoarseCtrlG, and FineCtrl.

In an exemplary operation with a target duty cycle of 40%, duty-cycle generator 10 may be used as follows. By means of a resistor ladder or other circuit, the user programs reference value 25 to a voltage that corresponds to the target 40% duty cycle, e.g., 400 mV for a 1V clock amplitude. If both delay lines 18, 19 are initially programmed to adjust the duty-cycle for Clock Out to 50% (ignoring any delays through the AND and OR gates of duty-cycle adjustment block 11), then the average value 24 arriving at comparator 15 should be close to VDD/2 (e.g., 500 mV for a 1V clock amplitude) and will be higher than reference value 25 (400 mV in this example), causing comparator 15 to output a o"0" as the value of comparison result signal 26. Once delay processor 16 receives the "0" value of comparison result signal 26, delay processor 16 will initiate the delay-update algorithm. The delay-update algorithm will synchronously increase or decrease the delay of bottom delay line 19 while causing MoreHighTime signal 32 to be low, causing the duty cycle to be reduced. After appropriate settling time, the output of comparator 15 will be re-sampled, and appropriate delay programming will be achieved via signals CoarseCtrl 29 and FineCtrl 31, as in the four phases described above, until the output of comparator 15 changes to "0". Subsequently, delay processor 16 will "ping-pong" the delay value using signal FineCtrl 31 to verify that the delay value constantly remains close to the corresponding desired programmed duty-cycle value.

The maximum error for duty-cycle generator 10 is the delay duration of one fine cell (e.g., 10 ps), which provides a much finer resolution than that provided by a conventional analog circuit. Additionally, because duty-cycle generator 10 is in constant operation, duty-cycle generator 10 can account for process, voltage, and temperature (PVT) changes. Moreover, in an application in which power conservation is important, delay processor 16 can be powered down, and its output values can remain available to be provided to the one or more delay lines, e.g., by storing the output values in a data register (e.g., NVRAM), which would not be practical using a conventional analog duty-cycle generator.

During and some time after the update of bottom delay line 19, delay processor 16 will either ignore the output of comparator 15, or power down comparator 15, or both. At some point, comparator 15 will be re-powered and/or its output will no longer be ignored.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing steps in a software program. Such software may be employed in, for example, a digital signal processor, micro-controller, or general purpose computer.

The present invention can be embodied in the form of methods and apparatuses for practicing those methods. It will be further understood that various changes in the details, materials, and arrangements of the parts which have been described and illustrated in order to explain the nature of this invention may be made by those skilled in the art without departing from the scope of the invention as expressed in the following claims.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

I claim:

1. A duty-cycle generator comprising:
a duty-cycle adjustment circuit adapted to:
receive an input clock signal having an input duty cycle;
generate first and second versions of the input clock signal having different non-zero amounts of delay; and
combine the first and second versions of the input clock signal to generate an output clock signal having an output duty cycle different from the input duty cycle;
a delay processor adapted to generate at least one control signal for controlling operations of the duty-cycle adjustment circuit based on a comparison of a characteristic of the output clock signal with a corresponding characteristic of a target output clock signal; and
a register adapted to store and provide one or more initial values for adjusting the input clock signal.

2. The invention of claim 1, wherein the duty-cycle adjustment circuit comprises:
a programmable delay line adapted to programmably delay the input clock signal to generate the first version of the input clock signal, wherein the amount of delay is based on one or more of the at least one control signal from the delay processor; and
digital logic adapted to combine the first and second versions of the input clock signal having different non-zero amounts of delay to generate the output clock signal.

3. The invention of claim 2, wherein the digital logic comprises:
logic adapted to generate a first combined version of the first and second versions of the input clock signal, wherein the first combined version corresponds to a logical OR operation of the first and second versions;
logic adapted to generate a second combined version of the first and second versions of the input clock signal, wherein the second combined version corresponds to a logical AND operation of the first and second versions; and
logic adapted to combine the first and second combined versions based on one or more of the at least one control signal from the delay processor to generate the output clock signal, wherein the one or more of the at least one control signal dictates whether the output duty cycle is greater than or less than the input duty cycle.

4. The invention of claim 1, further comprising an averaging circuit adapted to provide an average value of the output clock signal over a predefined period of time, wherein the average value is used to generate the characteristic of the output clock signal.

5. The invention of claim 4, wherein the averaging circuit comprises (i) at least one capacitor, (ii) a switch, and (iii) at least one resistor in parallel with the switch, wherein closure of the switch causes the output clock signal to bypass the resistor and to be provided directly to the capacitor.

6. The invention of claim 1, further comprising a comparator adapted to compare the characteristic of the output clock signal with the characteristic of a target output clock signal.

7. The invention of claim 6, wherein the delay processor is adapted to control whether or not the delay processor receives a result of the comparison from the comparator.

8. The invention of claim 6, wherein the comparator comprises back-to-back dual metastability flip-flops adapted to provide additional settling time in generating a comparison result if the characteristic of the output clock signal is substantially identical to the characteristic of the target output clock signal.

9. The invention of claim 1, further comprising a flip-flop adapted to store a result of the comparison, wherein the delay processor is adapted to provide the at least one control signal based on the stored result of a previous comparison instead of a result of a present comparison.

10. The invention of claim 1, wherein the characteristic of the output clock signal and the target output clock signal is voltage.

11. The invention of claim 1, further comprising two delay lines, each delay line providing one of the versions of the input clock signal.

12. The invention of claim 11, wherein the at least one control signal is provided to only a first of the delay lines to control delay duration, while the second of the delay lines remains at a substantially constant delay duration.

13. The invention of claim 11, wherein the first delay line is adapted to change delay duration in first increments by routing an input signal through a plurality of multiplexers having inverted outputs.

14. The invention of claim 13, wherein the first delay line is adapted to change delay duration in second increments by routing an input signal through a plurality of inverters.

15. The invention of claim 14, wherein the first and second increments are unequal.

16. The invention of claim 1, wherein the delay processor uses a result of the comparison to generate the at least one control signal repeatedly in bang-bang fashion, so that the duty cycle of the possibly adjusted output clock signal remains substantially as close as possible to the duty cycle of the target output clock signal.

17. The invention of claim 1, wherein the at least one control signal comprises a first control signal for coarse adjustment of the duty cycle and a second control signal for fine adjustment of the duty cycle.

18. The invention of claim 17, wherein the duty-cycle adjustment circuit is adapted to initially make coarse adjustments to the input clock signal based on the first control signal and subsequently make finer adjustments to the input clock signal based on the second control signal.

19. A duty-cycle generator comprising:
a duty-cycle adjustment circuit adapted to:
receive an input clock signal having an input duty cycle;
generate first and second versions of the input clock signal having different amounts of delay; and
combine the first and second versions of the input clock signal to generate an output clock signal having an output duty cycle different from the input duty cycle; and
a delay processor adapted to generate at least one control signal for controlling operations of the duty-cycle adjustment circuit based on a comparison of a characteristic of the output clock signal with a corresponding characteristic of a target output clock signal, wherein:
the duty-cycle adjustment circuit comprises:
a programmable delay line adapted to programmably delay the input clock signal to generate the first version of the input clock signal, wherein the amount of delay is based on one or more of the at least one control signal from the delay processor; and
digital logic adapted to combine the first and second versions of the input clock signal to generate the output clock signal, wherein the digital logic comprises:
logic adapted to generate a first combined version of the first and second versions of the input clock signal, wherein the first combined version corresponds to a logical OR operation of the first and second versions;

logic adapted to generate a second combined version of the first and second versions of the input clock signal, wherein the second combined version corresponds to a logical AND operation of the first and second versions; and logic adapted to combine the first and second combined versions based on one or more of the at least one control signal from the delay processor to generate the output clock signal, wherein the one or more of the at least one control signal dictates whether the output duty cycle is greater than or less than the input duty cycle.

20. A duty-cycle generator comprising:

a duty-cycle adjustment circuit adapted to:
  receive an input clock signal having an input duty cycle;
  generate first and second versions of the input clock signal having different amounts of delay; and
  combine the first and second versions of the input clock signal to generate an output clock signal having an output duty cycle different from the input duty cycle;

a delay processor adapted to generate at least one control signal for controlling operations of the duty-cycle adjustment circuit based on a comparison of a characteristic of the output clock signal with a corresponding characteristic of a target output clock signal; and an averaging circuit adapted to provide an average value of the output clock signal over a predefined period of time, wherein the average value is used to generate the characteristic of the output clock signal, wherein the averaging circuit comprises:
  (i) at least one capacitor,
  (ii) a switch, and
  (iii) at least one resistor in parallel with the switch, wherein closure of the switch causes the output clock signal to bypass the resistor and to be provided directly to the capacitor.

21. A duty-cycle generator comprising:

a duty-cycle adjustment circuit adapted to:
  receive an input clock signal having an input duty cycle;
  generate first and second versions of the input clock signal having different amounts of delay; and
  combine the first and second versions of the input clock signal to generate an output clock signal having an output duty cycle different from the input duty cycle;

a delay processor adapted to generate at least one control signal for controlling operations of the duty-cycle adjustment circuit based on a comparison of a characteristic of the output clock signal with a corresponding characteristic of a target output clock signal; and a comparator adapted to compare the characteristic of the output clock signal with the characteristic of a target output clock signal, wherein the comparator comprises back-to-back dual metastability flip-flops adapted to provide additional settling time in generating a comparison result if the characteristic of the output clock signal is substantially identical to the characteristic of the target output clock signal.

22. A duty-cycle generator comprising:

a duty-cycle adjustment circuit adapted to:
  receive an input clock signal having an input duty cycle;
  generate first and second versions of the input clock signal having different amounts of delay; and
  combine the first and second versions of the input clock signal to generate an output clock signal having an output duty cycle different from the input duty cycle;

a delay processor adapted to generate at least one control signal for controlling operations of the duty-cycle adjustment circuit based on a comparison of a characteristic of the output clock signal with a corresponding characteristic of a target output clock signal; and a flip-flop adapted to store a result of the comparison, wherein the delay processor is adapted to provide the at least one control signal based on the stored result of a previous comparison instead of a result of a present comparison.

* * * * *